(12) United States Patent
Kaneda

(10) Patent No.: US 12,159,865 B2
(45) Date of Patent: Dec. 3, 2024

(54) SEMICONDUCTOR DEVICE WITH EQUIPOTENTIAL RING ELECTRODE

(71) Applicant: ROHM CO., LTD., Kyoto (JP)

(72) Inventor: Hiroyuki Kaneda, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 18/178,913

(22) Filed: Mar. 6, 2023

(65) Prior Publication Data
US 2023/0207555 A1    Jun. 29, 2023

Related U.S. Application Data

(63) Continuation of application No. 16/870,437, filed on May 8, 2020, now Pat. No. 11,621,260, which is a
(Continued)

(30) Foreign Application Priority Data

Apr. 27, 2016 (JP) ................. 2016-089558

(51) Int. Cl.
H01L 27/02 (2006.01)
H01L 21/761 (2006.01)
(Continued)

(52) U.S. Cl.
CPC ........ *H01L 27/0255* (2013.01); *H01L 21/761* (2013.01); *H01L 29/0619* (2013.01);
(Continued)

(58) Field of Classification Search
CPC . H01L 27/0255; H01L 21/761; H01L 29/401; H01L 29/66734; H01L 29/408;
(Continued)

(56) References Cited

U.S. PATENT DOCUMENTS 6,194,309 B1    2/2001   Jin
6,249,023 B1 *  6/2001   Finney ............... H01L 29/7808
                                              257/341
(Continued)

FOREIGN PATENT DOCUMENTS

JP   2001326354    11/2001
JP   2009117715    5/2009
(Continued)

OTHER PUBLICATIONS

Office Action issued for Japanese Patent Application No. 2016-089558, Dispatch Date: Nov. 14, 2019, 10 pages Including English machine translation.
(Continued)

*Primary Examiner* — Nelson Garces
(74) *Attorney, Agent, or Firm* — XSENSUS LLP

(57) ABSTRACT

A semiconductor device includes a semiconductor substrate, an element region including an active element formed at the semiconductor substrate, a channel stopper formed in an outer peripheral region of the semiconductor substrate, and an insulating film that covers a surface of the semiconductor substrate and that has a first contact hole by which the channel stopper is exposed. The semiconductor device further includes a first field plate, a second field plate, and an equipotential ring electrode. The first field plate is formed on the insulating film, and faces the semiconductor substrate between the channel stopper and the element region through the insulating film. The second field plate is embedded in the insulating film, and faces the semiconductor substrate between the first field plate and the channel stopper through the insulating film. The equipotential ring electrode is formed an outer peripheral region of the semiconductor substrate. The equipotential ring electrode is connected to the channel stopper through the first contact hole, and is connected to the first field plate, and is connected to the
(Continued)

second field plate through a second contact hole formed in the insulating film.

19 Claims, 14 Drawing Sheets

Related U.S. Application Data continuation of application No. 15/496,596, filed on Apr. 25, 2017, now Pat. No. 10,692,850.

(51) Int. Cl.
| | |
|---|---|
| *H01L 29/06* | (2006.01) |
| *H01L 29/40* | (2006.01) |
| *H01L 29/66* | (2006.01) |
| *H01L 29/78* | (2006.01) |
| *H01L 29/861* | (2006.01) |
| *H01L 29/16* | (2006.01) |

(52) U.S. Cl.
CPC ...... *H01L 29/0638* (2013.01); *H01L 29/0696* (2013.01); *H01L 29/401* (2013.01); *H01L 29/404* (2013.01); *H01L 29/408* (2013.01); *H01L 29/66136* (2013.01); *H01L 29/66734* (2013.01); *H01L 29/7808* (2013.01); *H01L 29/7811* (2013.01); *H01L 29/7813* (2013.01); *H01L 29/861* (2013.01); *H01L 29/0623* (2013.01); *H01L 29/16* (2013.01)

(58) Field of Classification Search
CPC ............. H01L 29/7811; H01L 29/0623; H01L 29/0696; H01L 29/7813; H01L 29/404; H01L 29/0619; H01L 29/1095; H01L 29/0638; H01L 29/7397; H01L 29/0634; H01L 29/407; H01L 29/402; H01L 29/7395; H01L 29/0615; H01L 29/66348; H01L 29/0878; H01L 29/41766; H01L 29/872; H01L 29/4236; H01L 29/063; H01L 29/66727; H01L 29/861; H01L 27/088; H01L 29/66712; H01L 29/8611; H01L 29/7827; H01L 27/0629; H01L 29/0661; H01L 29/7802

See application file for complete search history.

(56) References Cited

U.S. PATENT DOCUMENTS

| | | | |
|---|---|---|---|
| 8,716,789 | B2 | 5/2014 | Ono et al. |
| 10,692,850 | B2 | 6/2020 | Kaneda |
| 2009/0090968 | A1* | 4/2009 | Ono .................... H01L 29/0623 |
| | | | 257/341 |
| 2010/0224909 | A1* | 9/2010 | Oohara ............... H01L 29/7811 |
| | | | 257/E29.198 |
| 2012/0126315 | A1 | 5/2012 | Onishi et al. |
| 2013/0248979 | A1 | 9/2013 | Ono et al. |
| 2014/0346593 | A1 | 11/2014 | Hsieh |
| 2015/0069536 | A1* | 3/2015 | Kim ..................... H01L 29/407 |
| | | | 257/412 |

FOREIGN PATENT DOCUMENTS

| | | |
|---|---|---|
| JP | 2013201167 | 10/2013 |
| JP | 2016035989 | 3/2016 |

OTHER PUBLICATIONS

Office Action issued for Japanese Patent Application No. 2016-089558, Dispatch Date: Feb. 27, 2020, 10 pages Including English machine translation.

* cited by examiner

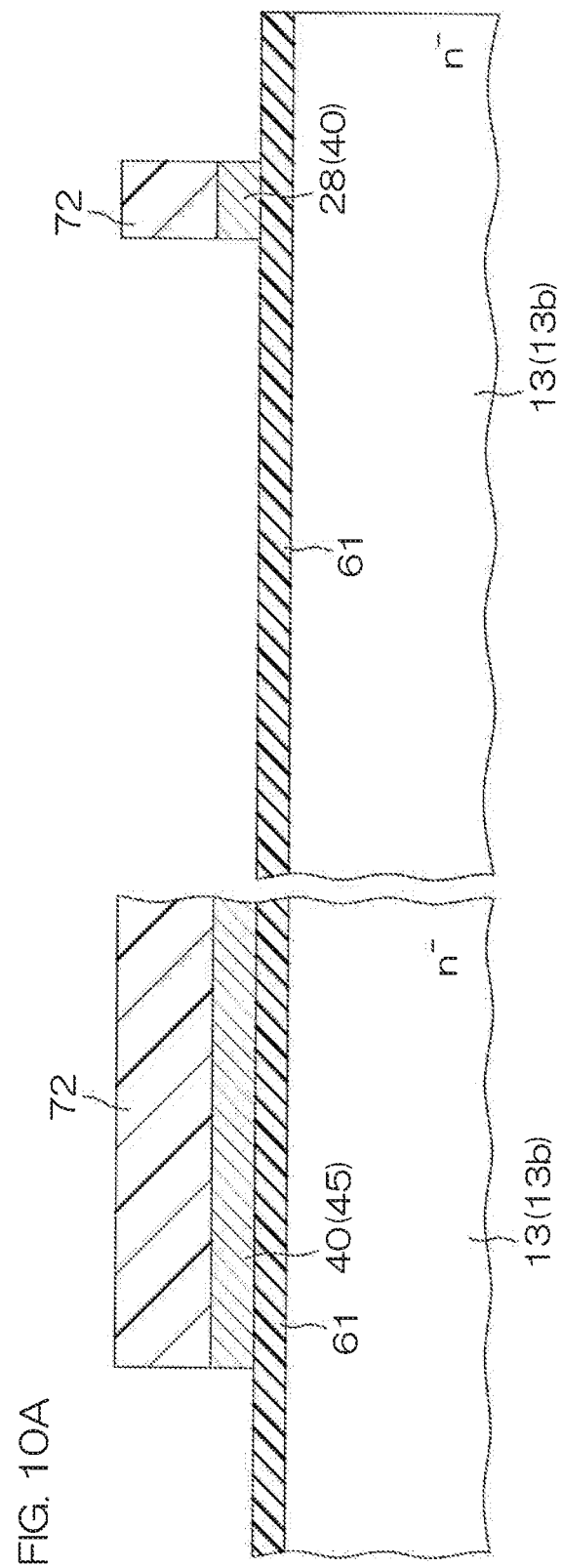

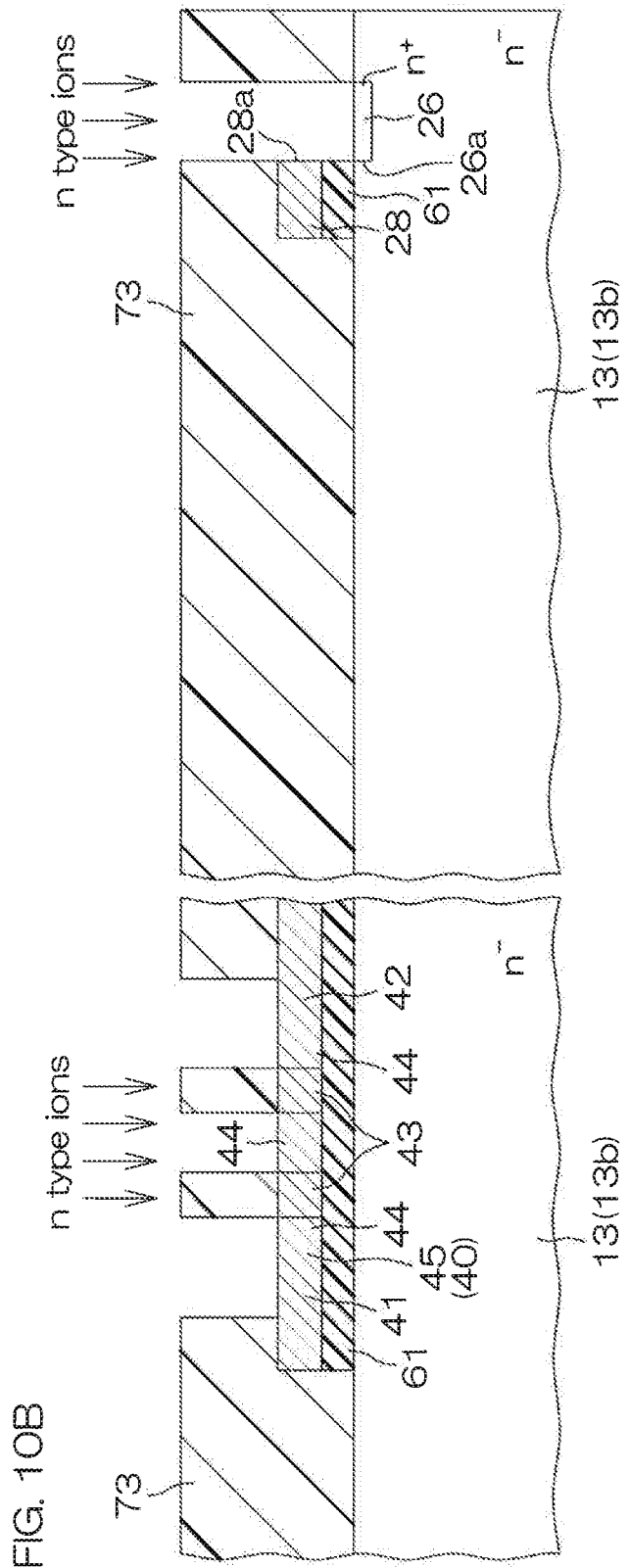

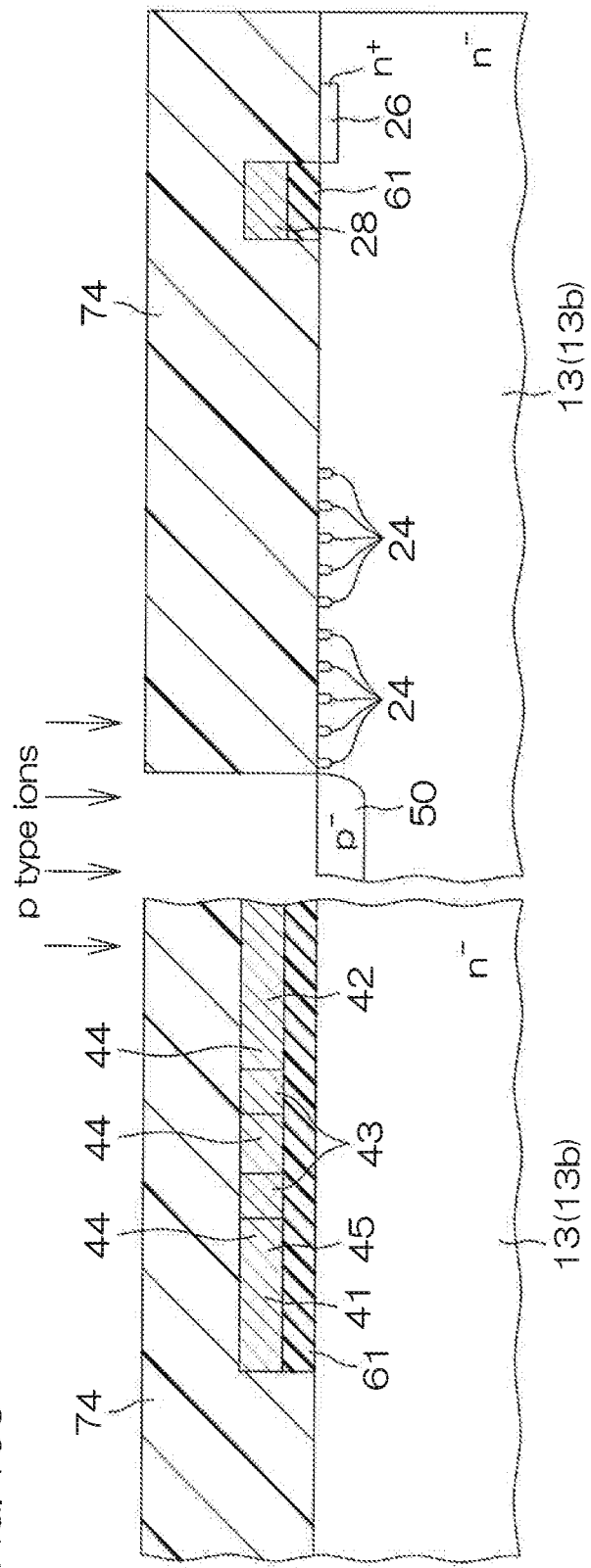

SEMICONDUCTOR DEVICE WITH EQUIPOTENTIAL RING ELECTRODE

BACKGROUND OF THE INVENTION

1. Field of the Invention

The present invention relates to a semiconductor device that includes an equipotential ring electrode in an outer peripheral region of a semiconductor substrate.

2. Description of the Related Art

United States Patent Application Publication No. 2012/0126315A1 discloses a semiconductor device that has an active region provided on a first main surface side and an n$^+$-drain region provided on a second main surface side. The active region is provided with a surface structure that includes an n$^+$-source region, a p-base region, a p$^+$-contact region, a source electrode, an interlayer insulating film, a gate insulating film, and a gate electrode. A peripheral region that surrounds the active region is disposed outside the active region. An n$^-$-type surface region is formed on the first main surface side, and a plurality of p-guard ring regions are disposed in the n$^-$-surface region at the peripheral region. The n$^-$surface region is covered with an insulating film, and a field plate electrode formed on the insulating film is connected to the outermost p-guard ring region. An n-channel stopper region is disposed in a terminal region of the peripheral region. A p-outermost peripheral region is disposed on the first main surface side of the n-type channel stopper region. This p-outer peripheral region is connected to a channel stopper electrode formed on the aforementioned insulating film.

SUMMARY OF THE INVENTION

One preferred embodiment of the present invention provides a semiconductor device that includes a semiconductor substrate of a first conductivity type, an element region including an active element formed at the semiconductor substrate, a channel stopper of the first conductivity type that is formed in an outer peripheral region of the semiconductor substrate so as to surround the element region, an insulating film that is formed so as to cover a surface of the semiconductor substrate and that has a first contact hole by which the channel stopper is exposed, a first field plate that is formed on the insulating film and that faces the semiconductor substrate between the channel stopper and the element region through the insulating film, a second field plate that is embedded in the insulating film and that faces the semiconductor substrate between the first field plate and the channel stopper through the insulating film, and an equipotential ring electrode that is formed along an outer peripheral region of the semiconductor substrate, that is connected to the channel stopper through the first contact hole, that is connected to the first field plate, and that is connected to the second field plate through a second contact hole formed in the insulating film.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 10A-10E are cross-sectional views showing major steps.

DETAILED DESCRIPTION OF THE PREFERRED EMBODIMENTS

Figure 1:
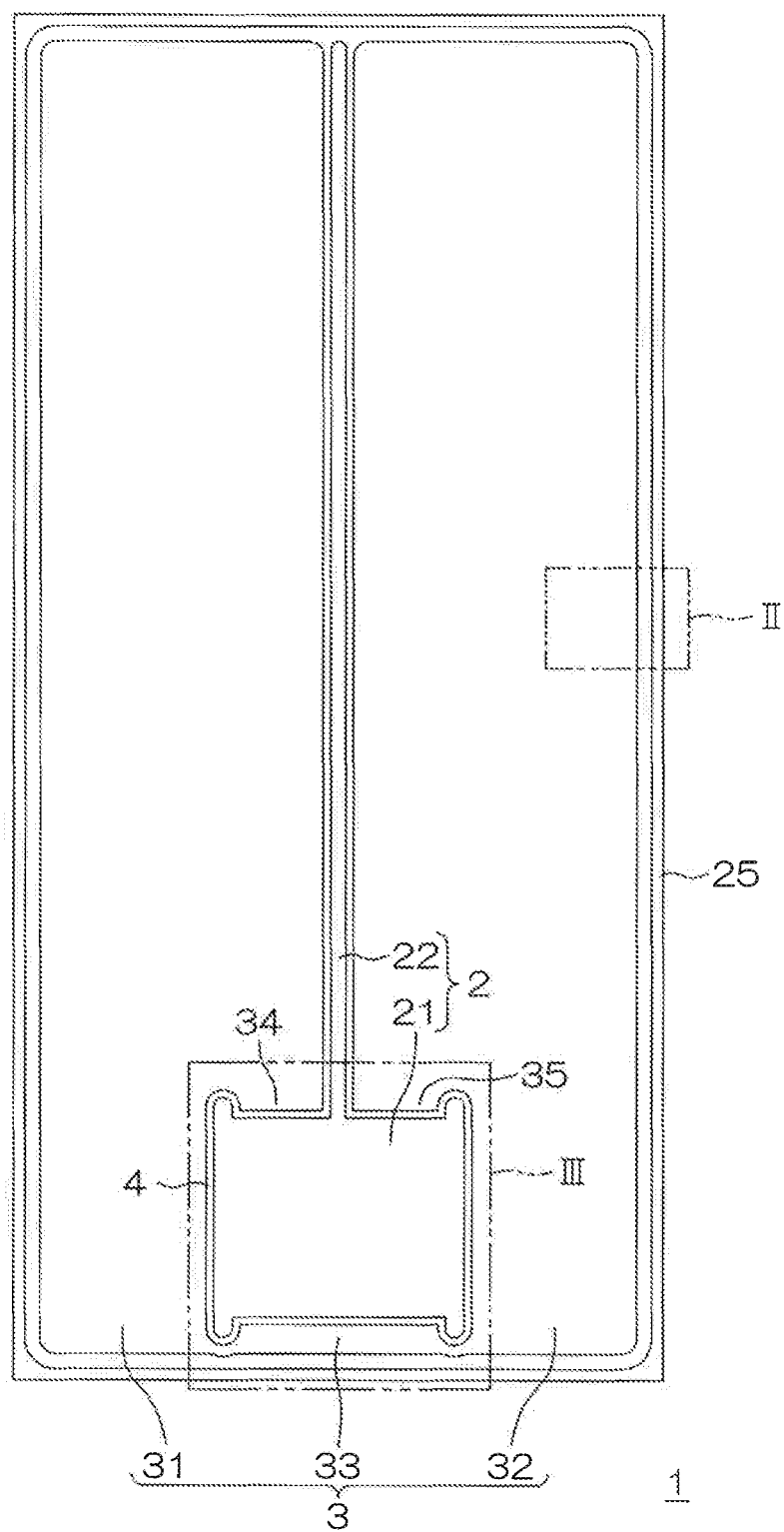
FIG. 1 is a plan view of a semiconductor device according to one preferred embodiment of the present invention.

One preferred embodiment of the present invention provides a semiconductor device that includes a semiconductor substrate of a first conductivity type, an element region (device region) including an active element (active device) formed at the semiconductor substrate, a channel stopper of the first conductivity type that is formed in an outer peripheral region of the semiconductor substrate so as to surround the element region, an insulating film that is formed so as to cover a surface of the semiconductor substrate and that has a first contact hole by which the channel stopper is exposed, a first field plate that is formed on the insulating film and that faces the semiconductor substrate between the channel stopper and the element region through the insulating film, a second field plate that is embedded in the insulating film and that faces the semiconductor substrate between the first field plate and the channel stopper through the insulating film, and an equipotential ring electrode that is formed along an outer peripheral region of the semiconductor substrate, that is connected to the channel stopper through the first contact hole, that is connected to the first field plate, and that is connected to the second field plate through a second contact hole formed in the insulating film.

In one preferred embodiment of the present invention, the insulating film has a first thickness between the first field plate and the semiconductor substrate, and has a second thickness smaller than the first thickness between the second field plate and the semiconductor substrate.

In one preferred embodiment of the present invention, the channel stopper is contiguous to a region of the first conductivity type of the semiconductor substrate.

In one preferred embodiment of the present invention, the second field plate is made of a polysilicon film.

In one preferred embodiment of the present invention, the semiconductor device further includes a MOSFET that is formed in the element region and that includes a channel region of a second conductivity type opposite to the first conductivity type and a protection diode connected between a gate and a source of the MOSFET. The protection diode is made of a polysilicon film formed in a same layer as the second field plate facing the semiconductor substrate through the insulating film.

In one preferred embodiment of the present invention, an inner edge of the channel stopper and an outer edge of the second field plate align with each other.

In one preferred embodiment of the present invention, the surface of the semiconductor substrate has a region of the first conductivity type directly under the first field plate and the second field plate.

According to one preferred embodiment of the present invention, it is possible to provide a semiconductor device that has a structure differing from that of a conventional technique in its outer peripheral region and that is capable of improving reliability. Particularly, it is possible to provide a semiconductor device in which the time-dependent change of leakage characteristics is small.

Preferred embodiments of the present invention will be hereinafter described in detail with reference to the accompanying drawings.

FIG. 1 is a plan view of a semiconductor device according to one preferred embodiment of the present invention. The semiconductor device 1 has a gate electrode 2 and a source electrode 3 on an upper surface. The semiconductor device 1 has a substantially rectangular shape in a plan view. The gate electrode 2 has a pad portion 21 formed in a substantially rectangular shape and a cell connection portion 22 that linearly extends from the pad portion 21. The cell connection portion 22 extends along the longitudinal direction of the semiconductor device 1, and extends linearly so as to substantially halve the upper surface of the semiconductor device 1. The pad portion 21 is continuous with an end of the cell connection portion 22, and is disposed near a central part of one short side of the semiconductor device 1 such that one side of the pad portion 21 is along the central part of the short side in a plan view. The source electrode 3 is provided with respect to the gate electrode 2 with a gap 4 between the source electrode 3 and the gate electrode 2. The source electrode 3 includes a first part 31 and a second part 32 that are symmetrical with respect to the gate electrode 2 and a connection portion 33 that comes around the pad portion 21 and by which the first and second parts 31 and 32 are connected together. The first and second parts 31 and 32 have projecting portions 34 and 35, respectively, that protrude toward the inside of the pad portion 21, and corresponding parts of the pad portion 21 are correspondingly hollowed toward the inside thereof. Additionally, the connection portion 33 protrudes toward the inside of the pad portion 21, and a corresponding part of the pad portion 21 is correspondingly hollowed toward the inside thereof.

Figure 2:
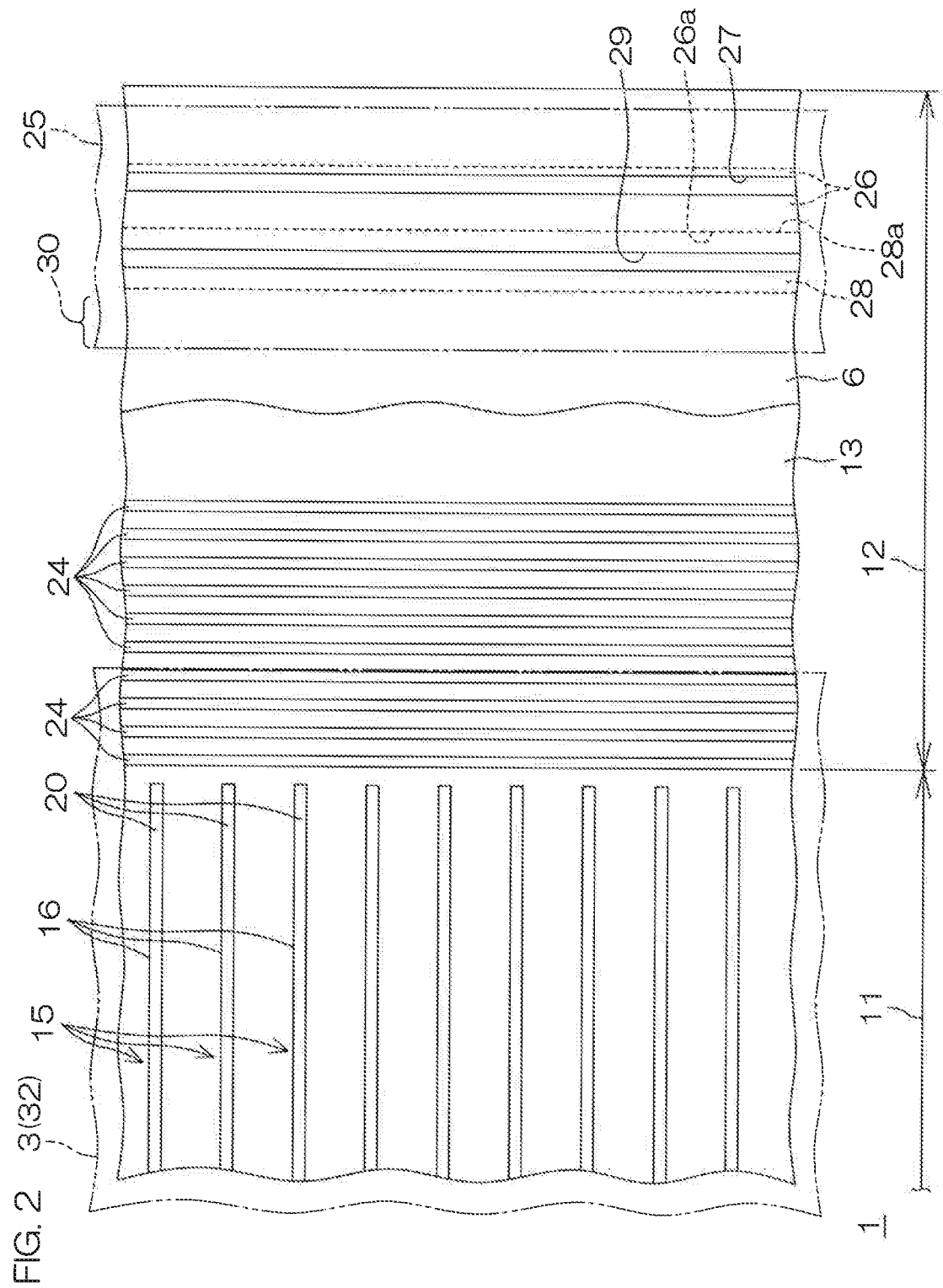
FIG. 2 is a partially-enlarged plan view showing an enlarged internal structure of part II of FIG. 1.

FIG. 2 is a partially-enlarged plan view showing an enlarged internal structure of part II of FIG. 1, and depicts the internal structure excluding the source electrode 3, an interlayer insulating film and a protective film that are disposed on a surface, and so on. A semiconductor substrate 13 that is a component of the semiconductor device 1 includes a device region or an element region 11 and an outer peripheral region 12 that surrounds the element region 11.

The element region 11 is a region having an active device or active element formed at the semiconductor substrate 13. In the present preferred embodiment, a trench-gate type vertical MOSFET (Metal Oxide Semiconductor Field Effect Transistor) is formed in the element region 11, and, as a result, the semiconductor device 1 forms an individual MOSFET chip. More specifically, a plurality of MOSFET cells 15 are formed in the element region 11, and sources of those MOSFET cells 15 are connected to the source electrode 3 in common with each other, and their gates are connected to the gate electrode 2 in common with each other, and their drains are connected to the drain electrode 5 in common with each other (see FIG. 4).

In more detail, the conductivity type in the inside of the element region 11 is controlled to be an n⁻ type. The element region 11 has a plurality of gate trenches 16 formed in a stripe manner. A plurality of gate conductors 20 are embedded in the plurality of gate trenches 16, respectively. Each gate conductor 20 is connected to the cell connection portion 22 of the gate electrode 2 (see FIG. 1).

An annular p type guard ring 24 (so-called field limiting ring) that surrounds the element region 11 is formed in a multiple manner in the outer peripheral region 12. The p type guard ring 24 is an annular p type region formed at a surface layer portion of the semiconductor substrate 13. The source electrode 3 shown by a phantom line in FIG. 2 is formed on an interlayer insulating film 6 (which is not shown in FIG. 2. See FIG. 4) with which a surface of the semiconductor substrate 13 is covered, and covers the element region 11 with the interlayer insulating film 6 therebetween, and extends to a space above some p type guard rings 24 disposed relatively inside. An equipotential ring electrode 25 is disposed apart from the source electrode 3 outside the outermost p type guard ring 24. The equipotential ring electrode 25 is a ring-shaped electrode that is placed at a substantially outermost periphery of the semiconductor device 1 and that is continuous over the entire periphery of the outer peripheral edge of the surface of the semiconductor device 1. An n⁺ type channel stopper 26 is formed below the equipotential ring electrode 25 inside the semiconductor substrate 13 so as to be exposed to the surface of the semiconductor substrate 13. The n⁺ type channel stopper 26 is an annular n type region formed along the outer periphery of the semiconductor device 1 over its entire periphery. The equipotential ring electrode 25 is formed on the interlayer insulating film 6 (which is not shown in FIG. 2. See FIG. 5) with which the surface of the semiconductor substrate 13 is covered, and is connected to the n⁺ type channel stopper 26 through a first contact hole 27 formed in the interlayer insulating film 6. The first contact hole 27 is open in an annular pattern manner along the n⁺ type channel stopper 26 over the entire periphery of the outer peripheral part of the semiconductor substrate 13.

A field plate 28 made of, for example, polysilicon that has been made electroconductive by introducing an n type impurity is disposed on the inner side of the n⁺ type channel stopper 26. The polysilicon field plate 28 is embedded in the interlayer insulating film 6, and faces the semiconductor substrate 13 through the interlayer insulating film 6. The polysilicon field plate 28 is formed in an annular shape that extends along the outer periphery of the semiconductor substrate 13 over the entire periphery. An outer edge 28a of the polysilicon field plate 28 aligns with an inner edge 26a of the n⁺ type channel stopper 26.

The equipotential ring electrode 25 is formed in a belt-shaped pattern having a width that reaches the inside of the polysilicon field plate 28 through a space above the polysilicon field plate 28. A second contact hole 29 is formed in the interlayer insulating film 6 above the polysilicon field plate 28. The second contact hole 29 is open in an annular pattern manner along the polysilicon field plate 28. The equipotential ring electrode 25 and the polysilicon field plate 28 are connected together through the second contact hole 29. The equipotential ring electrode 25 faces the semiconductor substrate 13 through the interlayer insulating film 6 inside the polysilicon field plate 28. In other words, the equipotential ring electrode 25 has a field plate portion 30 that faces the semiconductor substrate 13 through the interlayer insulating film 6. The field plate portion 30 is an example of the first field plate, and the polysilicon field plate 28 is an example of the second field plate.

Figure 3:
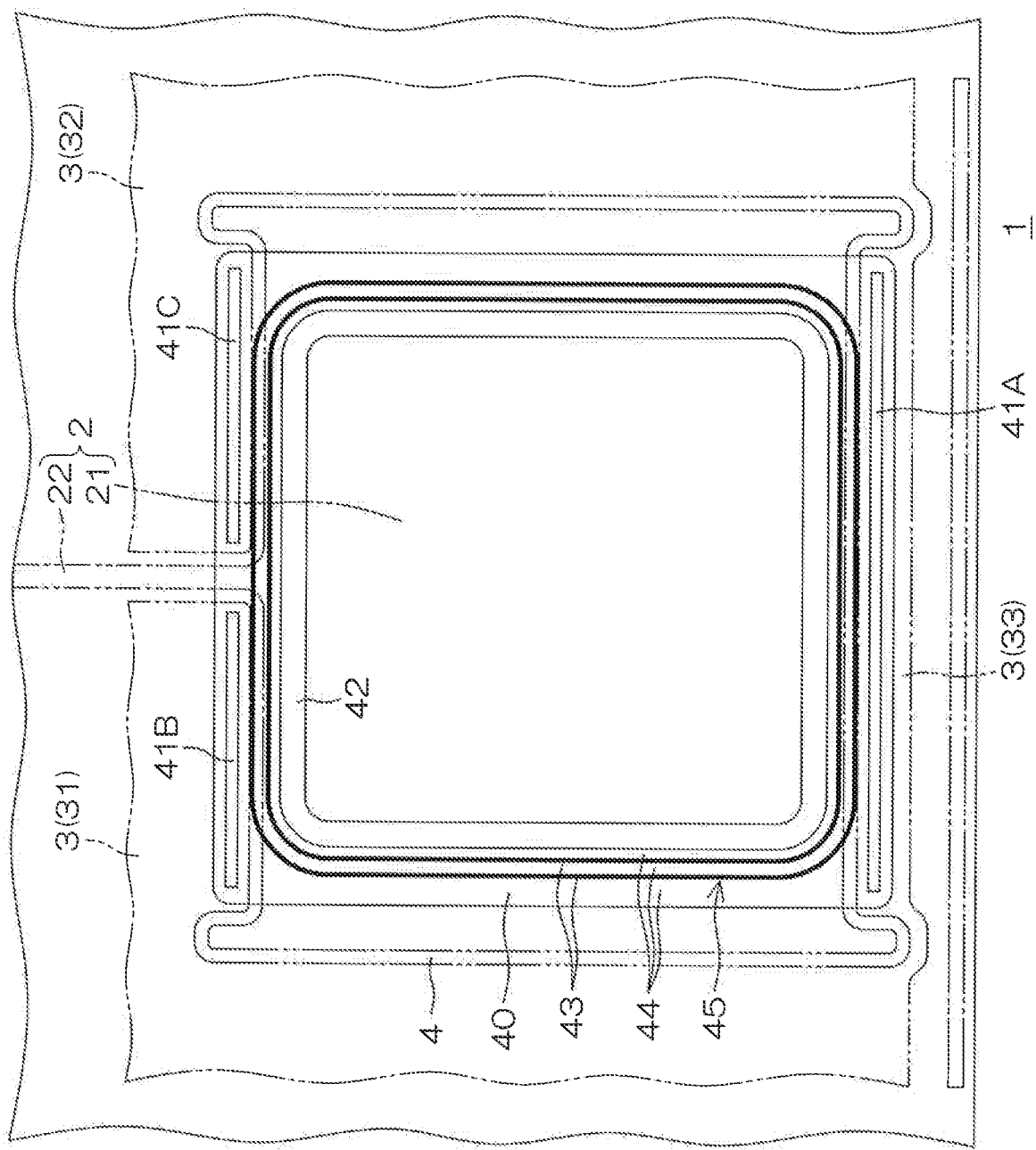
FIG. 3 is a partially-enlarged plan view showing an enlarged internal structure of part III of FIG. 1.

FIG. 3 is a partially-enlarged plan view showing an enlarged internal structure of part III of FIG. 1, and depicts the internal structure excluding the source electrode 3, the gate electrode 2, the interlayer insulating film, and so on.

A first interlayer insulating film 61 (which is not shown in FIG. 3. See FIG. 6) is formed on the surface of the semiconductor substrate 13, and a polysilicon film 40 is formed on the first interlayer insulating film 61. The polysilicon film 40 is controlled as an n type, for example, by introducing phosphorus that is an n type impurity. The polysilicon film 40 is formed in a rectangular shape (in the present preferred embodiment, a substantially square shape) in the pad portion 21. In this rectangular polysilicon film 40, first contact portions 41A, 41B, and 41C for a connection with the source electrode 3 (which are generically referred to as a "first contact portion 41") are provided near two sides that face each other. The first contact portion 41 includes a first part 41A that extends along one side of the polysilicon film 40 near a terminal part of the semiconductor substrate 13 and second and third parts 41B and 41C both of which extend along another side facing the one side. The second part 41B and the third part 41C are placed apart from each other with the cell connection portion 22 of the gate electrode 2 therebetween.

The source electrode 3 is connected to the first contact portion 41 through a contact hole 66 (see FIG. 6) formed in a second interlayer insulating film 62 (see FIG. 6) with which the polysilicon film 40 is covered. A plurality of annular p type regions 43 are formed in a multiple manner inside the first contact portion 41. These annular p type regions 43 partition the region of the n type polysilicon film 40, and, as a result, a plurality of annular n type regions 44 are defined in a multiple manner. The annular p type regions 43 and the annular n type regions 44 form a protection diode 45. A second contact portion 42 is formed inside the multiple annular p type regions 43. The gate electrode 2 is connected to the second contact portion 42 through a contact hole 67 (see FIG. 6) formed in the second interlayer insulating film 62 (see FIG. 6) with which the polysilicon film 40 is covered. Thus, the protection diode 45 is connected between the gate electrode 2 and the source electrode 3.

The protection diode 45 allows an electrostatic surge input into the gate to pass through the source, thus protecting the MOSFET cell 15.

Figure 4:
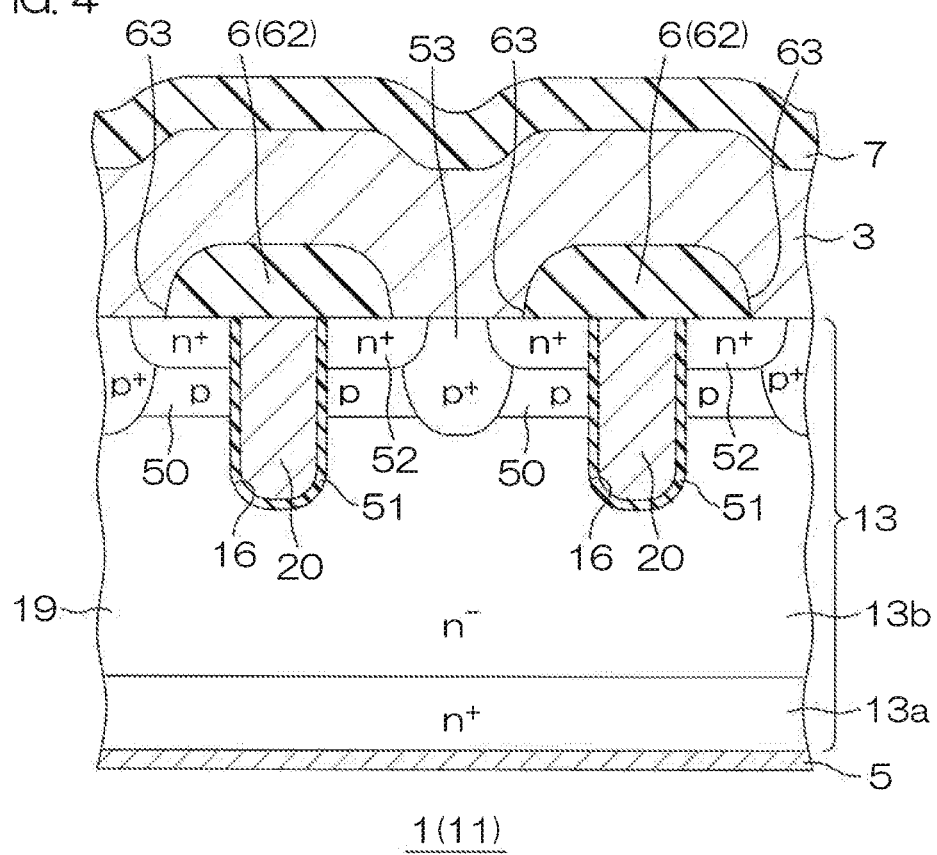
FIG. 4 is a partially-enlarged cross-sectional view showing a structure example of an element region.

FIG. 4 is a partially-enlarged cross-sectional view showing a concrete structure example of the element region 11. The semiconductor substrate 13 is formed by growing an n⁻ type epitaxial layer 13b on an n⁺ type silicon substrate 13a, and these form a drain region. A p type channel region 50 (body region) is formed at a surface layer portion of the n⁻ type epitaxial layer 13b. The gate trench 16 that reaches the drain region through the p type channel region 50 from the surface is formed at the n⁻ type epitaxial layer 13b. A gate insulating film 51 is formed on an inner surface of the gate trench 16. The gate conductor 20 is embedded in the inward side of the gate insulating film. An n⁺ type source region 52 is formed at a surface layer portion of the p type channel region 50 in a peripheral edge portion of the gate trench 16. In other words, the gate trench 16 passes through the n⁺ type source region 52 and the p type channel region 50. The gate conductor 20 has its upper part facing the n⁺ type source region 52, has its intermediate part facing the p type channel region 50, and has its lower part facing the n⁻ type epitaxial layer 13b (drain region). The interlayer insulating film 6 is formed so as to cover the gate conductor 20 and a part of the n⁺ type source region 52. A contact hole 63 by which a part of the n⁺ type source region 52 is exposed is formed in the interlayer insulating film 6. A p⁺ type channel contact layer 53 is formed in a region exposed from the contact hole 63. The p⁺ type channel contact layer 53 passes through the n⁺ type source region 52, and is joined to the p type channel region 50. The source electrode 3 is formed on the interlayer insulating film 6, and is joined to the p⁺ type channel contact layer 53 and to the n⁺ type source region 52 through the contact hole 63.

A surface of the source electrode 3 is covered with a passivation film 7 made of, for example, a silicon nitride film. The drain electrode 5 that makes ohmic contact with the n⁺ type silicon substrate 13a is formed on a reverse surface of the semiconductor substrate 13.

Figure 5:
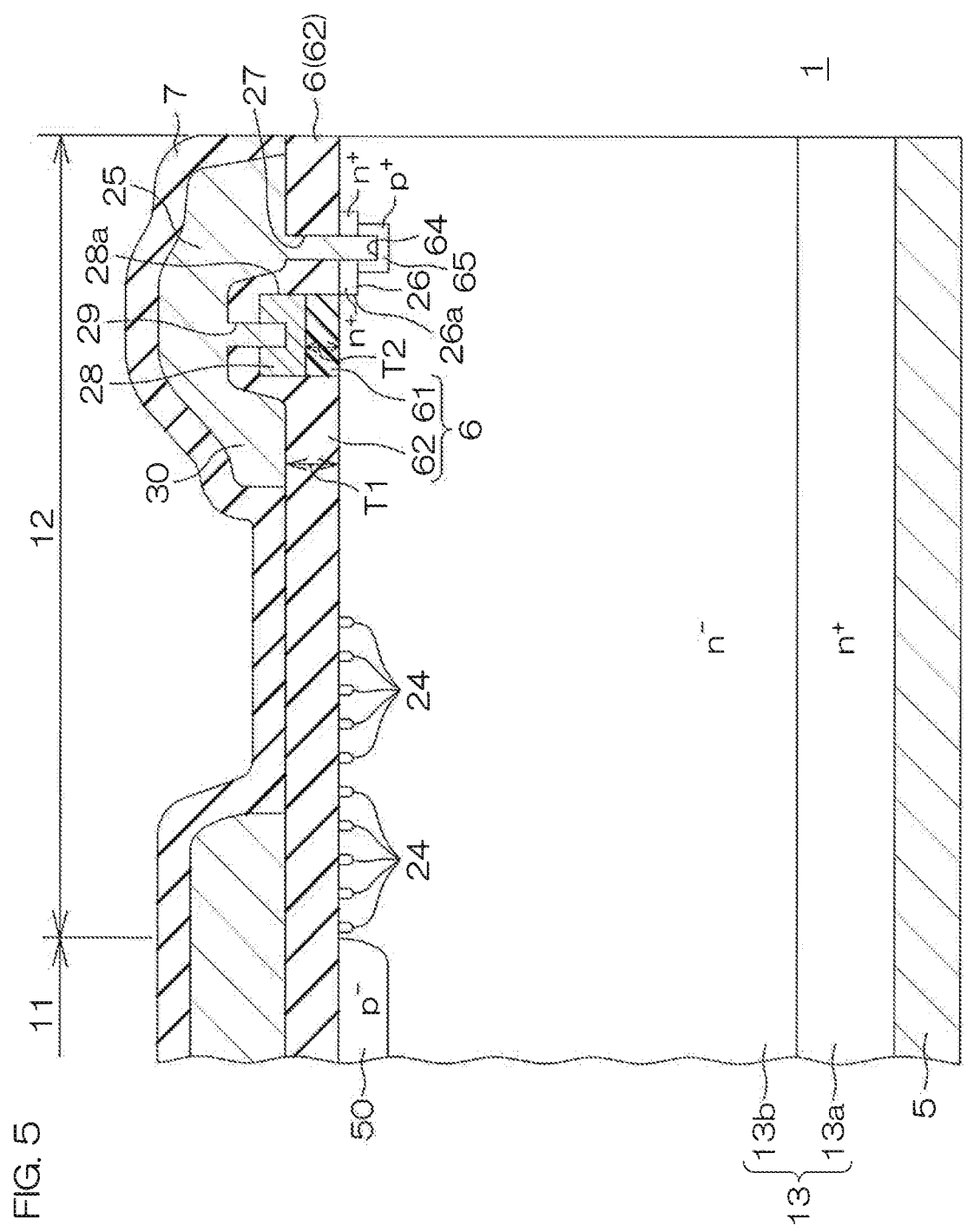
FIG. 5 is a cross-sectional view to describe a structure example of an outer peripheral region.

FIG. 5 is a cross-sectional view to describe a structure example of the outer peripheral region 12. The p type channel region 50 is not formed in the outer peripheral region 12, and the n⁻ type epitaxial layer 13b is exposed to the surface of the semiconductor substrate 13. The n⁻ type epitaxial layer 13b has the n type (n⁺ type) channel stopper 26 formed near a terminal region. The first contact hole 27 by which the n⁺ type channel stopper 26 is exposed is formed in the interlayer insulating film 6 formed on the surface of the semiconductor substrate 13. In the present preferred embodiment, a recess portion 64 is formed at the semiconductor substrate 13 so as to be continuous with the first contact hole 27, and the recess portion 64 passes through the n⁺ type channel stopper 26. Therefore, in a sidewall of the recess portion 64, the n⁺ type channel stopper 26 is exposed. A p⁺ type layer 65 is formed near a bottom of the recess portion 64. The p⁺ type layer 65 is a highly-concentrated p type layer that is formed simultaneously when the p⁺ type channel contact layer 53 (see FIG. 5) is formed. The equipotential ring electrode 25 is formed on the interlayer insulating film 6, and is connected to the n⁺ type channel stopper 26 through the first contact hole 27. The n⁺ type channel stopper 26 is contiguous to the n⁻ type epitaxial layer 13b, and therefore the equipotential ring electrode 25 makes direct contact with the drain region (i.e., the n⁻ type epitaxial layer 13b and the n⁺ type silicon substrate 13a) without a pn junction interposed therebetween.

On the other hand, the polysilicon field plate 28 is disposed in an inner region of the n⁺ type channel stopper 26, and is embedded in the interlayer insulating film 6. In more detail, the interlayer insulating film 6 includes the first interlayer insulating film 61 interposed between the polysilicon field plate 28 and the semiconductor substrate 13 and the second interlayer insulating film 62 with which the polysilicon field plate 28 is covered. Therefore, the polysilicon field plate 28 is formed between the first interlayer insulating film 61 and the second interlayer insulating film 62, and hence is embedded in the interlayer insulating film 6. The polysilicon field plate 28 faces the n⁻ type epitaxial layer 13b through the first interlayer insulating film 61. The position of the outer edge 28a of the polysilicon field plate and the position of the inner edge 26a of the n⁺ type channel stopper 26 aligns with each other.

The second contact hole 29 is formed in the second interlayer insulating film 62 directly on the polysilicon field plate 28. The equipotential ring electrode 25 is connected to the polysilicon field plate 28 through the second contact hole 29.

The equipotential ring electrode 25 integrally has the field plate portion 30 that extends to a region (closer to the element region 11) inner than the polysilicon field plate 28 and that faces the surface of the n⁻ type epitaxial layer 13b through the second interlayer insulating film 62. The field plate portion 30 faces the n⁻ type epitaxial layer 13b through the second interlayer insulating film 62, whereas the polysilicon field plate 28 faces the n⁻ type epitaxial layer 13b through the first interlayer insulating film 61. A first thickness T1 of the interlayer insulating film 6 between the field plate portion 30 and the semiconductor substrate 13 (i.e., thickness of the second interlayer insulating film 62) is greater than a second thickness T2 of the insulating film between the polysilicon field plate 28 and the semiconductor substrate 13 (i.e., thickness of the first interlayer insulating film 61).

The surface of the source electrode 3 and that of the equipotential ring electrode 25 are covered with the passivation film 7. The passivation film 7 is contiguous to the surface of the interlayer insulating film 6 in a region between the source electrode 3 and the equipotential ring electrode 25. In a region between the equipotential ring electrode 25 and the element region 11, the p type guard ring 24 is formed on the surface of the semiconductor substrate 13 in a multiple manner, and surrounds the element region 11.

Figure 6:
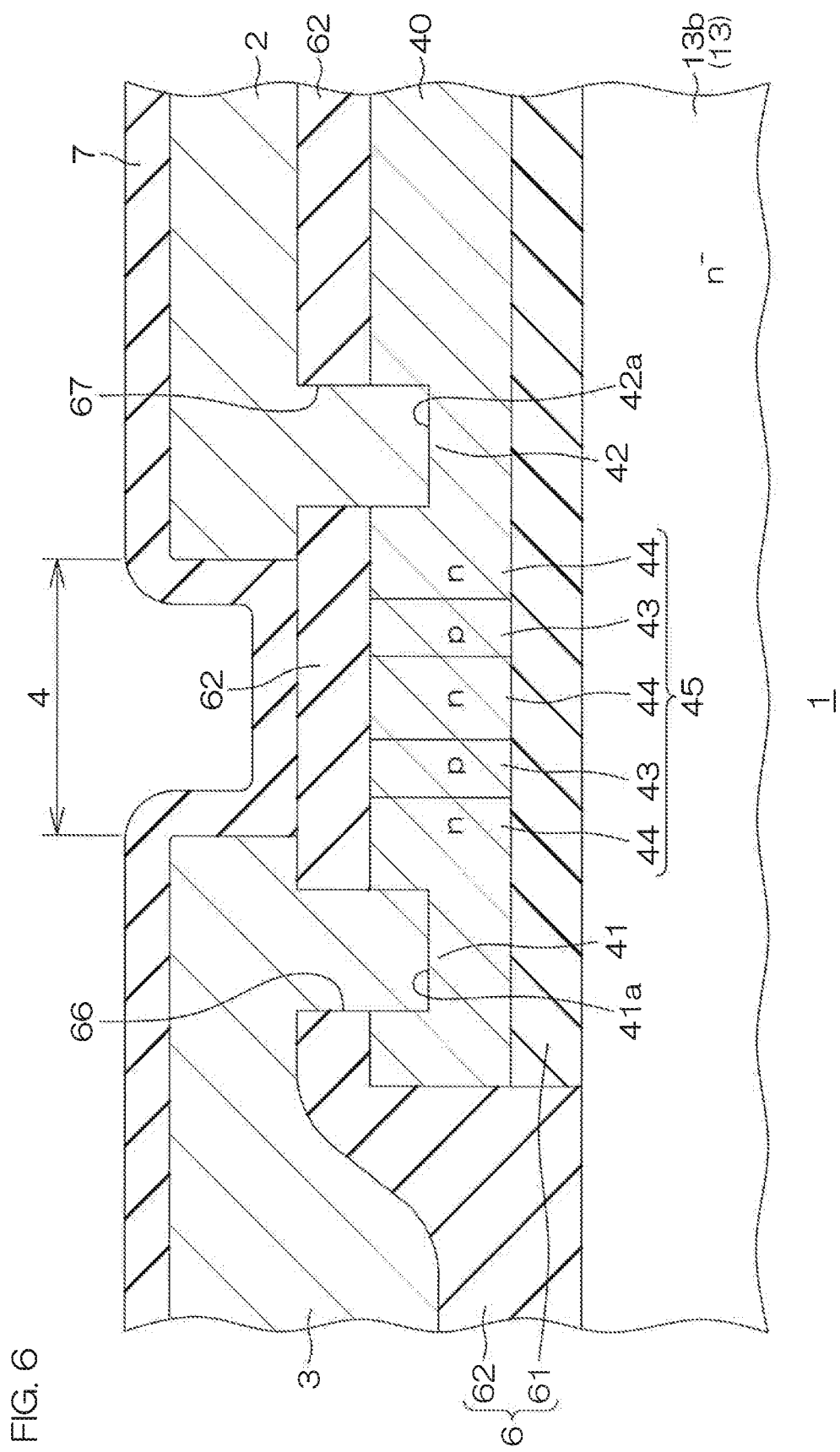
FIG. 6 is a pictorial cross-sectional view to describe an arrangement of a protection diode.

FIG. 6 is a pictorial cross-sectional view to describe an arrangement of the protection diode 45. The polysilicon film 40 is formed on the first interlayer insulating film 61, and the conductivity type of the polysilicon film 40 is controlled to be an n type. Inside the polysilicon film 40, the plurality of annular p type regions 43 are formed with intervals therebetween, and, as a result, the plurality of annular n type regions 44 are defined. As a result, a plurality of pn junctions are formed. These pn junctions serve as components of the protection diode 45. The first contact portion 41 is disposed on one side of the protection diode 45, and is connected to the source electrode 3 through the contact hole 66 formed in the second interlayer insulating film 62. The second contact portion 42 is disposed on the other side of the protection diode 45, and is connected to the gate electrode 2 through the contact hole 67 formed in the second interlayer insulating film 62. In the present preferred embodiment, the first contact portion 41 and the second contact portion 42 have recess portions 41a and 42a, respectively, that are formed by an etching performed when the contact holes 66 and 67 are formed.

Figure 7A:
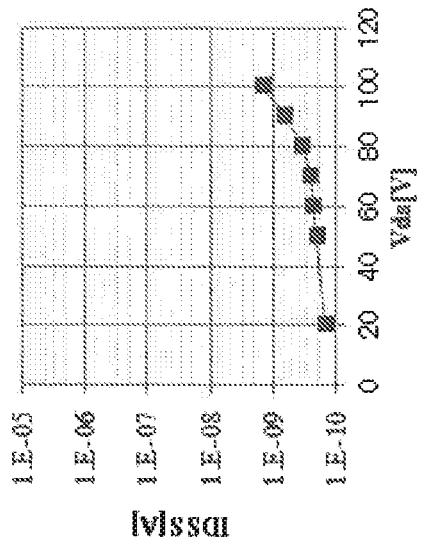
FIG. 7A, FIG. 7B, and FIG. 7C show examples of reliability test results, respectively (preferred embodiment).
Figure 7B:
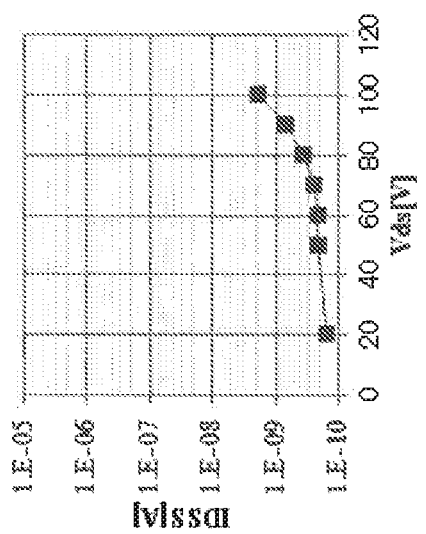
Figure 7C:
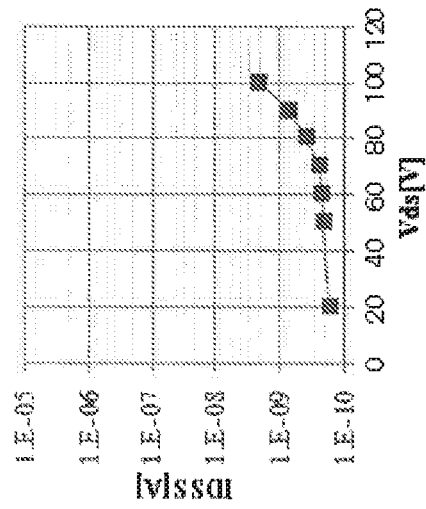

FIG. 7A, FIG. 7B, and FIG. 7C show examples of reliability test results, each showing a change in drain-to-source leakage current after having made a HTRB (high-temperature reverse bias) test. The abscissa axis of each figure represents a drain-to-source voltage Vds, whereas the ordinate axis of each figure represents a drain-to-source leakage current IDSS. FIG. 7A shows a measurement result in an initial state before making the test, FIG. 7B shows a measurement result 240 hours after the start of the test, and FIG. 7C shows a measurement result 1000 hours after the start of the test. From the comparison of these measurement results, it is understood that a characteristic change from the initial state does not substantially occur even 1000 hours after the start of the test, and the leakage current does not increase.

Figure 8A:
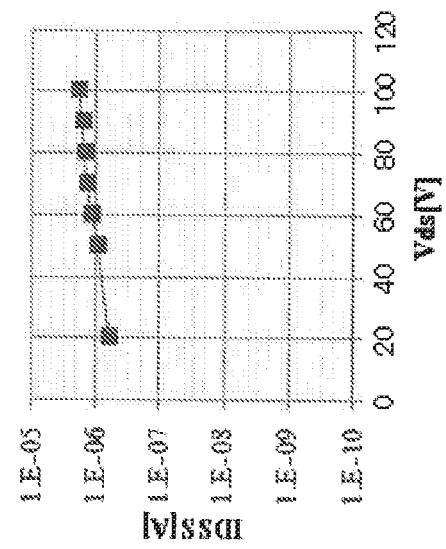
FIG. 8A, FIG. 8B, and FIG. 8C show examples of reliability test results, respectively, in an arrangement according to a comparative example.
Figure 8B:
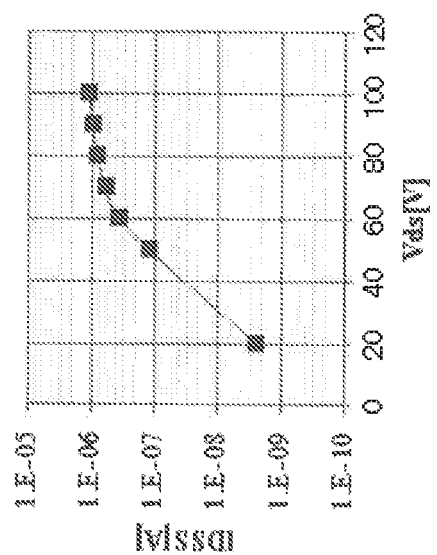
Figure 8C:
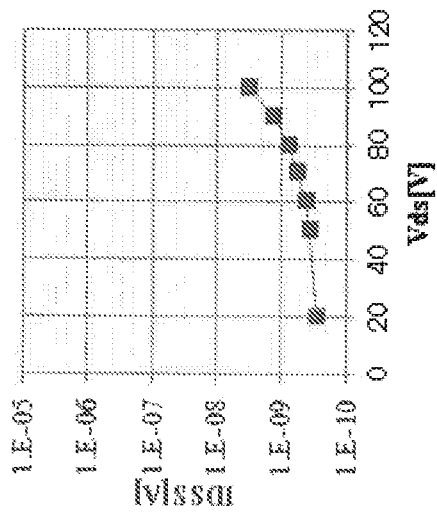

FIG. 8A, FIG. 8B, and FIG. 8C show examples of reliability test results in an arrangement according to a comparative example, each showing a change in drain-to-source leakage current after having made a HTRB test. The abscissa axis of each figure represents a drain-to-source voltage Vds, whereas the ordinate axis of each figure represents a drain-to-source leakage current IDSS. In the comparative example, a p type region having substantially identical characteristics with the p type channel region is formed at the surface layer portion of the n⁻ type epitaxial layer in the outer peripheral region.

FIG. 8A shows a measurement result in an initial state before making the test, FIG. 8B shows a measurement result 240 hours after the start of the test, and FIG. 8C shows a measurement result 1000 hours after the start of the test. From the comparison of these measurement results, it is understood that the leakage current increases according to the HTRB test. Presumably, this is caused by a leakage path generated such that it runs through the p type region from the terminal of the semiconductor substrate.

Figure 9:
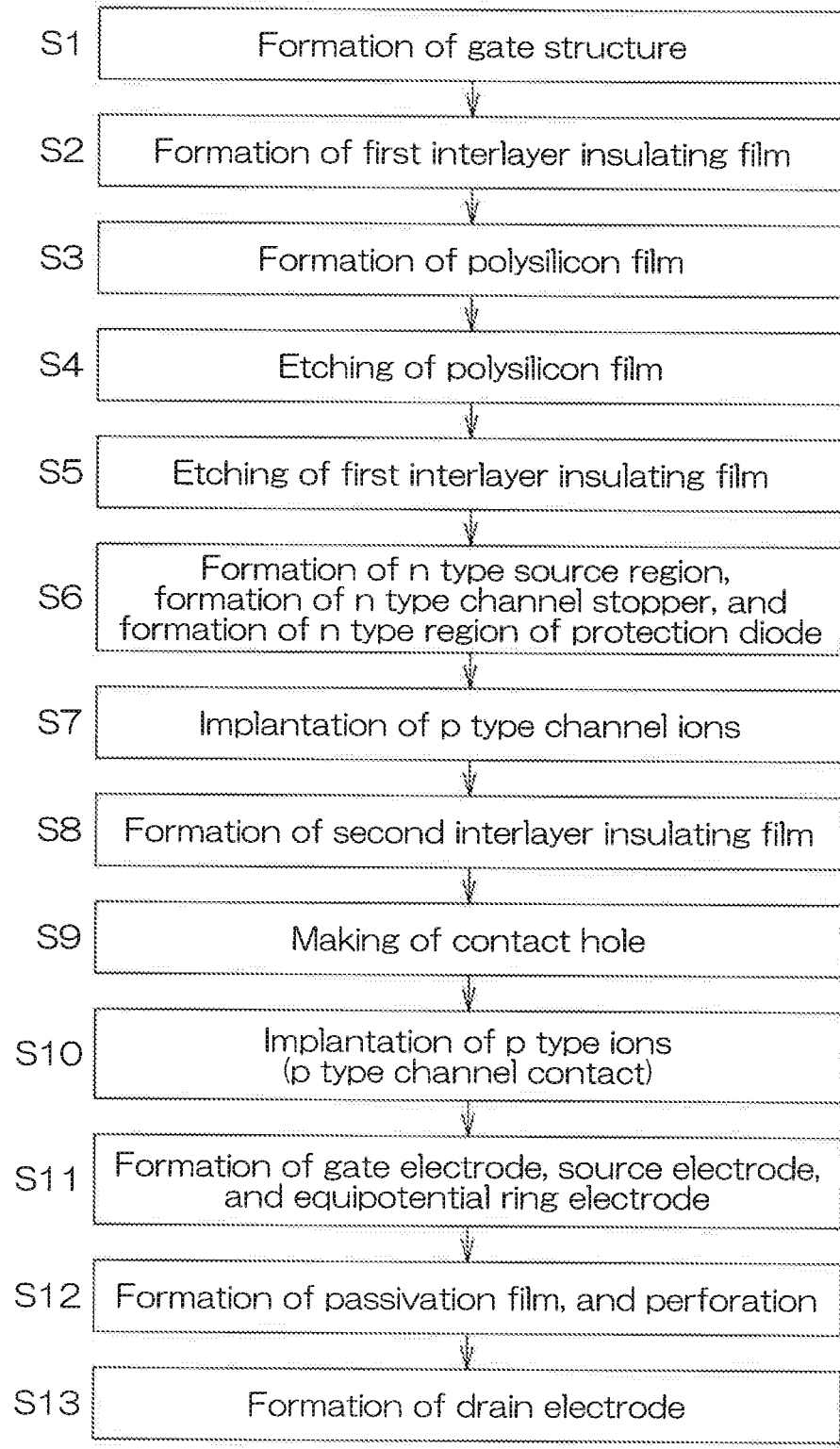
FIG. 9 is a flowchart to describe a process for manufacturing the semiconductor device.

FIG. 9 is a flowchart to describe a process for manufacturing the semiconductor device 1. FIG. 10A to FIG. 10E are cross-sectional views in main steps in the process, in each of which the outer peripheral region 12 is shown on the right side, and a region in which the protection diode 45 is formed is shown on the left side.

A gate structure that includes the gate trench 16, the gate insulating film 51, the gate conductor 20, and so on is formed (S1), and then the first interlayer insulating film 61 is formed in the element region 11 and the outer peripheral region 12 (S2). The first interlayer insulating film 61 may be a silicon oxide film formed by a CVD (Chemical Vapor Deposition) method, and its film thickness may be, for example, about 3000 Å (second thickness T2). The polysilicon film 40 (for example, a film thickness of 6000 Å) is formed on the first interlayer insulating film 61 (S3), and p type ions are implanted into its entire surface.

Thereafter, as shown in FIG. 10A, a resist mask 72 with which the pad portion 21 of the gate electrode 2 (see FIG. 1) and a part of the polysilicon field plate 28 (see FIG. 2) are covered is formed, and the polysilicon film 40 is etched by etching that is performed through the resist mask 72 (S4). Thereby, the rectangular polysilicon film 40 including the region of the protection diode 45 is formed in the pad portion 21, and the annular polysilicon field plate 28 that is continuous over the entire periphery of the outer peripheral region 12 is formed in the outer peripheral region 12. Thereafter, the resist mask 72 is peeled off, and then one other resist mask is formed, and the first interlayer insulating film 61 of the element region 11 is removed by etching through the other resist mask (S5). Thereafter, the resist mask is peeled off.

Thereafter, as shown in FIG. 10B, the n⁺ type source region 52 (see FIG. 4) and the n⁺ type channel stopper 26 are formed by implanting n type impurity ions through a resist mask 73 (S6). Simultaneously, the n type region 44 and the contact portions 41 and 42 each of which is in an n type region are formed at the polysilicon film 40 in the region of the protection diode 45. Thereafter, the resist mask 73 is peeled off. Ions are stopped by the polysilicon field plate 28, and, as a result, the n⁺ type channel stopper 26 has the inner edge 26a that aligns with the outer edge 28a of the polysilicon field plate.

Thereafter, as shown in FIG. 10C, channel ion implantation (p type impurity ion implantation) is performed with respect to the surface layer portion of the n⁻ type epitaxial layer 13b through an opening of the resist mask 74, so that the p type channel region 50 is formed (S7). Simultaneously, the p type guard ring 24 is formed in the outer peripheral region 12. It should be noted that an opening to be formed in the resist mask 74 correspondingly to the p type guard ring 24 is not shown in FIG. 10C. In regions that should not undergo ion implantation, particularly, in the outer peripheral region 12, parts outside the p type guard ring 24 are protected by the resist mask 74, and channel ion implantation is not applied to the n⁻ type epitaxial layer 13b of the outer peripheral region 12. Thereafter, the resist mask 74 is peeled off.

Figure 10D:
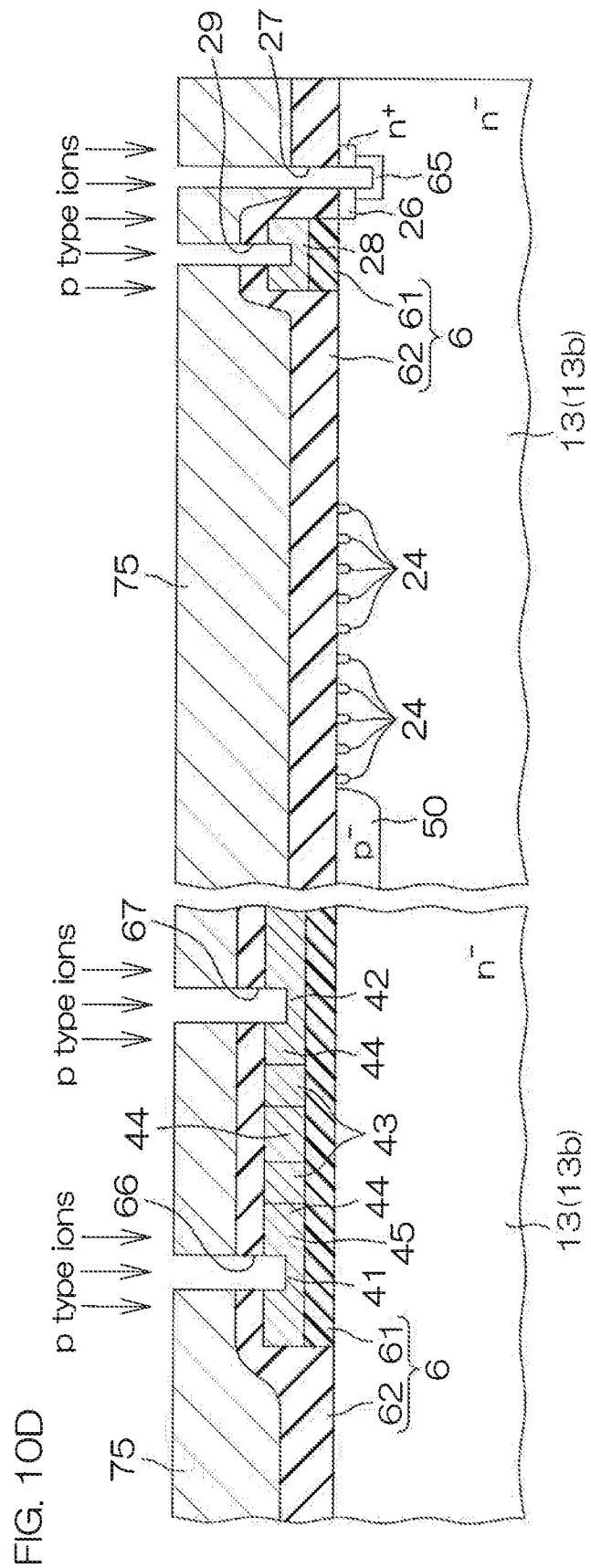

Thereafter, as shown in FIG. 10D, the second interlayer insulating film 62 is formed (S8). The second interlayer insulating film 62 may be a laminated film consisting of a CVD oxide film (for example, a film thickness of 2000 Å) and a TEOS (tetraethoxysilane) oxide film (for example, a film thickness of 3500 Å). The thickness (first thickness T1) of the second interlayer insulating film 62 may be 5500 Å to 6000 Å. Furthermore, a resist mask 75 is formed on the second interlayer insulating film 62, and the contact holes 27, 29, 63 (see FIG. 4), 66, and 67 are formed by etching through the resist mask 75 (S9). Thereafter, furthermore, p type impurity ions are implanted, and, as a result, the p⁺ type channel contact layer 53 (see FIG. 4) is formed directly under the contact hole 63, and the p⁺ type layer 65 is formed in the n⁻ type epitaxial layer 13b directly under the contact hole 27 (S10). At this time, p type impurity ions are also implanted into the contact portions 41 and 42 of the protection diode 45 through the contact holes 66 and 67, and yet the contact portions 41 and 42 are each kept as an n type because the concentration of n type impurities that have been implanted simultaneously with the ion implantation (S6) performed for the n⁺ type source region is high. On the other hand, a region including the exposed surface of the polysilicon field plate 28 becomes a p type by performing ion implantation through the contact hole 29. Thereafter, the resist mask 75 is peeled off.

Figure 10E:
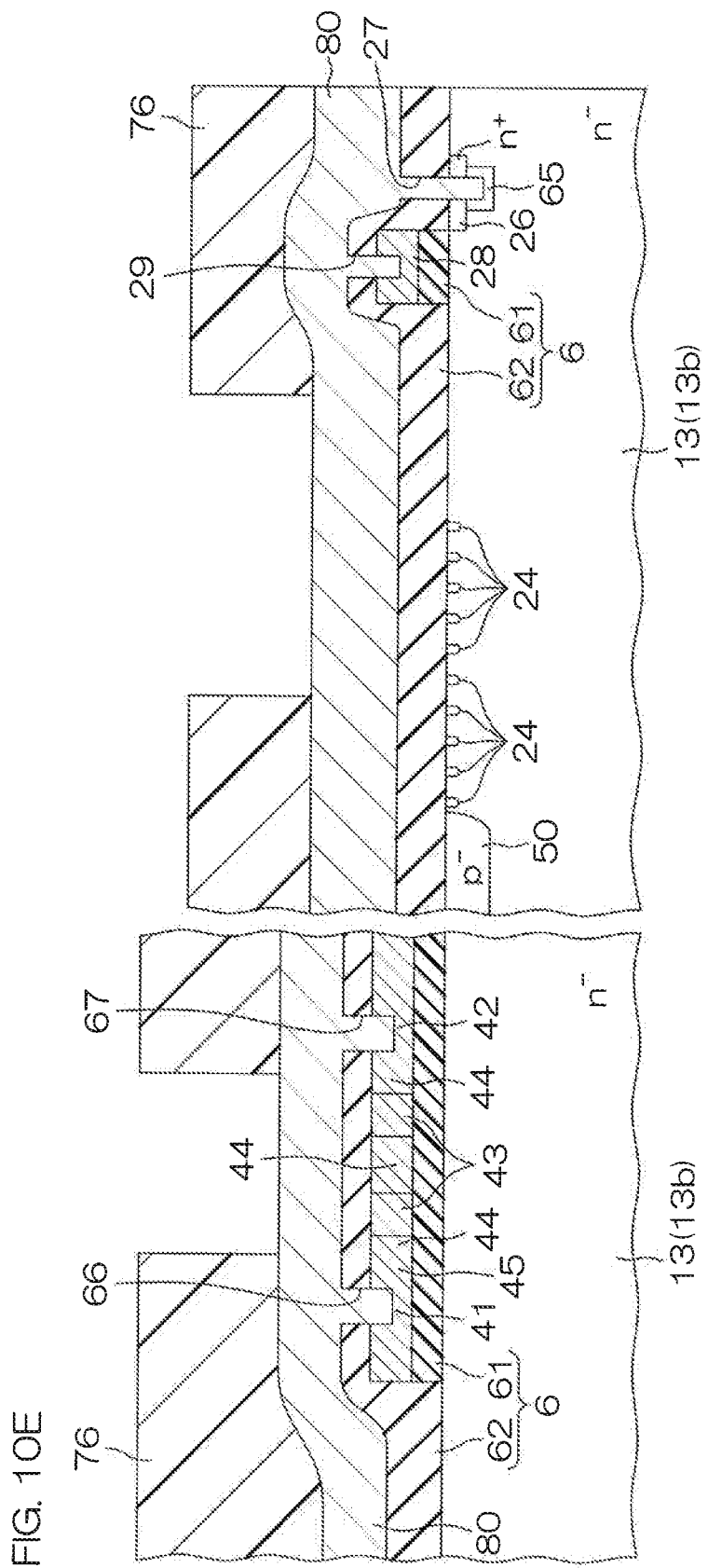

Thereafter, as shown in FIG. 10E, an aluminum-based metal film 80 is formed by, for example, sputtering. A resist mask 76 is formed on the metal film 80, and the metal film 80 undergoes patterning by etching through the resist mask 76. As a result, the metal film 80 is divided into the gate electrode 2, the source electrode 3, and the equipotential ring electrode 25 (S11).

Thereafter, the passivation film 7 made of a nitride film or the like is formed by, for example, plasma CVD, and is perforated, so that a gate pad and a source pad are formed on the gate electrode 2 and the source electrode 3, respectively (S12). Furthermore, the reverse surface of the n⁺ type silicon substrate 13a is ground if needed, and then a metal film, such as an aluminum film, is formed on the reverse surface of the silicon substrate 13a so as to serve as the drain electrode 5 (S13).

As described above, according to the present preferred embodiment, the polysilicon field plate 28 embedded in the interlayer insulating film 6 in the outer peripheral region 12 is disposed inside the n⁺ type channel stopper 26, and is connected to the equipotential ring electrode 25. The field plate portion 30 of the equipotential ring electrode 25 is disposed inside the polysilicon field plate 28. The thus formed structure makes it possible to stepwise lessen the electric field by means of the plurality of field plates 28 and 30 inside the n⁺ type channel stopper 26, and hence makes it possible to avoid the concentration of an electric field near the n⁺ type channel stopper 26. As a result, it is possible to realize a semiconductor device 1 having high reliability while restraining a leakage current and restraining a time-dependent change in the leakage current.

Additionally, in the present preferred embodiment, the interlayer insulating film 6 (second interlayer insulating film 62) has the first thickness T1 between the field plate portion 30 (first field plate) and the semiconductor substrate 13, and the interlayer insulating film 6 (first interlayer insulating film 61) has the second thickness T2 between the polysilicon field plate 28 (second field plate) and the semiconductor substrate 13. The second thickness T2 is smaller than the first thickness T1. This makes it possible to lessen the electric field more effectively because the field plates 30, 28 and the semiconductor substrate 13 become closer to each other in proportion to an approach to the n⁺ type channel stopper 26 from the element region 11.

Additionally, in the present preferred embodiment, the n⁺ type channel stopper 26 is contiguous with the n⁻ type epitaxial layer 13b, and therefore the equipotential ring electrode 25 is connected directly to the drain region. Therefore, it is possible to reliably equalize the electric potential of the outer peripheral region 12 of the semiconductor substrate 13, and hence is possible to improve the breakdown voltage, and is possible to realize a semiconductor device 1 having high reliability.

Additionally, in the present preferred embodiment, the protection diode 45 connected between the gate and source of the MOSFET formed in the element region 11 is made of the polysilicon film 40, and the polysilicon field plate 28 is formed in the same layer as the polysilicon film 40. Therefore, it is possible to simultaneously form the protection diode 45 and the polysilicon field plate 28, and therefore it is possible to simplify the manufacturing process.

Additionally, in the present preferred embodiment, the inner edge 26a of the channel stopper 26 and the outer edge 28a of the polysilicon field plate 28 aligns with each other, and therefore it is possible to more reliably avoid the concentration of an electric field near the channel stopper 26, and hence is possible to realize a semiconductor device 1 having high reliability.

Additionally, in the present preferred embodiment, a p type region equivalent to the p type channel region 50 is not formed in the n⁻ type epitaxial layer 13b in the outer peripheral region 12, and the surface of the semiconductor substrate 13 directly under the field plate portion 30 and the polysilicon field plate 28 is in the n⁻ type region. This makes it possible to avoid a leakage path formed to run through the surface of the semiconductor substrate 13, and hence makes it possible to realize a semiconductor device 1 having high reliability.

Although the preferred embodiment of the present invention has been described as above, the present invention can be embodied in other modes. For example, the p type region and the n type region may be reversed in the aforementioned preferred embodiment. Additionally, although the first field plate is formed integrally with the equipotential ring electrode 25 as described in the above preferred embodiment, the first field plate may be provided independently of the equipotential ring electrode 25. Additionally, although the first thickness T1 of the interlayer insulating film 6 between the field plate portion 30 (first field plate) and the semiconductor substrate 13 is greater than the second thickness T2 of the interlayer insulating film 6 between the polysilicon field plate 28 and the semiconductor substrate 13 as described in the above preferred embodiment, the magnitude relationship therebetween may be reversed, and the first and second thicknesses T1 and T2 may be equal to each other. Additionally, although the polysilicon film 40 and the polysilicon field plate 28 that are components of the protection diode 45 are made of polysilicon films formed in the same layer as described in the above preferred embodiment, these films may be formed in mutually different layers, respectively.

The present application corresponds to Japanese Patent Application No. 2016-089558 filed in the Japan Patent Office on Apr. 27, 2016, and the entire disclosure of the application is incorporated herein by reference.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A semiconductor device comprising:
a semiconductor substrate of a first conductivity type;
an element region including an active element formed at the semiconductor substrate;
a guard ring having a first width and provided on an outer peripheral region of the semiconductor substrate, the guard ring reaching a first depth from a surface of the semiconductor substrate;
an insulating film formed so as to cover the surface of the semiconductor substrate, the insulating film having a first contact hole formed through the insulating film;
a second conductivity type layer having a second width greater than the first width and formed in a region of the semiconductor substrate beneath the first contact hole; and
a guard ring electrode formed over the insulating film in the outer peripheral region of the semiconductor substrate, the guard ring electrode facing the semiconductor substrate over the first contact hole, wherein
the guard ring electrode has a protrusion extending through the first contact hole to reach the second conductivity type layer, a depression at a surface portion thereof corresponding to the protrusion, and a slope at a bottom portion thereof extending toward the first contact hole, and
the second conductivity type layer is formed at a depth from the surface of the semiconductor substrate beneath the guard ring electrode and reaches a second depth greater than the first depth from the surface of the semiconductor substrate.

2. The semiconductor device according to claim 1, wherein the guard ring electrode has a surface including a slope portion that becomes steeper toward a top of the slope portion.

3. The semiconductor device according to claim 2, wherein the surface of the semiconductor substrate has a region of the first conductivity type directly under the guard ring electrode.

4. The semiconductor device according to claim 3, wherein the insulating film is in contact with a bottom surface of the guard ring electrode and is in contact with the surface of the semiconductor substrate below the bottom surface of the guard ring electrode.

5. The semiconductor device according to claim 4, further comprising a MOSFET formed in the element region, the MOSFET including a channel region of a second conductivity type that is opposite to the first conductivity type.

6. The semiconductor device according to claim 5, further comprising a protection diode connected between a gate and a source of the MOSFET.

7. The semiconductor device according to claim 6, wherein the second conductivity type layer has a cross-sectional area that is larger than a cross-sectional area of the guard ring when viewed in a cross section.

8. The semiconductor device according to claim 7, further comprising an embedded impurity region of the first conductivity type that is formed in the outer peripheral region of the semiconductor substrate so as to surround the element region.

9. The semiconductor device according to claim 8, wherein a side surface of the protrusion is in contact with the embedded impurity region.

10. The semiconductor device according to claim 9, wherein the embedded impurity region is contiguous to a region of the first conductivity type of the semiconductor substrate.

11. The semiconductor device according to claim 10, further comprising a field plate embedded in the insulating film, the field plate facing the semiconductor substrate between an inner edge of the guard ring electrode and the first contact hole through the insulating film,
wherein the guard ring electrode is connected to the field plate through a second contact hole formed in the insulating film.

12. The semiconductor device according to claim 11, wherein
the top surface of the field plate has a recess, and
the guard ring electrode extends into the recess of the field plate.

13. The semiconductor device according to claim 12, wherein the insulating film has a first thickness between the guard ring electrode and the semiconductor substrate and has a second thickness smaller than the first thickness between the field plate and the semiconductor substrate.

14. The semiconductor device according to claim 13, wherein an inner edge of the embedded impurity region and an outer edge of the field plate align with each other.

15. The semiconductor device according to claim 14, wherein the insulating film includes a first insulating layer in contact with a bottom surface of the field plate and a second insulating layer in contact with the top surface of the field plate and the bottom surface of the guard ring electrode.

16. The semiconductor device according to claim 15, wherein the second insulating layer is in contact with the surface of the semiconductor substrate below the bottom surface of the guard ring electrode.

17. The semiconductor device according to claim 16, wherein the second insulating layer is in contact with a bottom surface of the guard ring electrode and is in contact with the surface of the semiconductor substrate below the bottom surface of the guard ring electrode.

18. The semiconductor device according to claim 17, wherein
the field plate is made of a polysilicon film, and
the protection diode is made of a polysilicon film formed in a same layer as the field plate so as to face the semiconductor substrate through the insulating film.

19. The semiconductor device according to claim 18, wherein the protection diode is formed between the first and second insulating layers.

* * * * *